(12) United States Patent
Takechi et al.

(10) Patent No.: US 6,207,342 B1
(45) Date of Patent: Mar. 27, 2001

(54) CHEMICALLY AMPLIFIED RESIST MATERIAL AND PROCESS FOR THE FORMATION OF RESIST PATTERNS

(75) Inventors: Satoshi Takechi; Isamu Hanyu, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/065,567

(22) Filed: Apr. 24, 1998

(30) Foreign Application Priority Data

Oct. 9, 1997 (JP) .................................................. 9-277570

(51) Int. Cl.$^7$ ...................................................... G03F 7/004
(52) U.S. Cl. ......................................... 430/270.1; 430/910
(58) Field of Search ................................. 430/270.1, 910

(56) References Cited

U.S. PATENT DOCUMENTS 5,968,713 * 10/1999 Nozaki et al. ........................ 430/326

FOREIGN PATENT DOCUMENTS

| 196 26 003 | 1/1997 | (DE) . |
| 4-39665 | 2/1992 | (JP) . |
| 9-73173 | 3/1997 | (JP) . |
| 9-90637 | 4/1997 | (JP) . |

\* cited by examiner

*Primary Examiner*—John S. Chu
(74) *Attorney, Agent, or Firm*—Armstrong, Westerman, Hattori, McLeland & Naughton, LLP

(57) ABSTRACT

Chemically amplified resist material which comprises: I. an acid-sensitive terpolymer produced upon copolymerization of (i) a first monomer unit having a structure which contains an alkali-soluble group protected with an alicyclic hydrocarbon-containing protective group, (ii) a second monomer unit having a lactone structure, and (iii) a third monomer unit having a structure which contains an alkali-soluble group protected with a protective group different from that of said first monomer unit; and II. a photoacid generator capable of producing an acid upon exposure to a patterning radiation, and the process for forming resist patterns using this resist material.

8 Claims, No Drawings

CHEMICALLY AMPLIFIED RESIST MATERIAL AND PROCESS FOR THE FORMATION OF RESIST PATTERNS

BACKGROUND OF THE INVENTION

1. Field of the Invention

The present invention relates to a resist material and, more particularly, to a novel chemically amplified resist material which can exhibit a high resolution, high sensitivity, excellent resistance to dry etching and can be produced at a low cost. The present invention also relates to a process for the formation of resist patterns using such a novel resist material. The resist material of the present invention can be advantageously utilized in the production of semiconductor devices such as semiconductor integrated circuits, for example LSIs, VLSIs and ULSIs, and other devices.

2. Description of the Related Art

Recently, in the production of semiconductor integrated circuits, the degree of integration thereof has notably increased and, accordingly, LSIs and VLSIs have been produced on a commercial scale. The minimum line width of the circuit patterns in these devices approaches the order of a submicron or a quarter micron. In other words, in the production of these high performance devices, it is required to provide a fine fabrication technology for forming fine resist patterns.

Using a fine fabrication technology, fine resist patterns can generally be produced by coating a substrate having on a surface thereof a layer or coating to be fabricated, such as a layer to be selectively etched, with a chemically amplified resist material, and exposing the resist film to patterning radiation to thereby form a latent image corresponding to a pattern of said radiation. The latent image of the resist film is then developed with a suitable developer. A desired resist pattern is thus obtained. The resist pattern can be effectively utilized as a masking means in the subsequent dry etching process to selectively etch the underlying layer. The patterning radiation generally includes ultraviolet radiation such as the g-line (wavelength of 436 nm) and i-line (wavelength of 365 nm). However, it also includes other radiation having shorter wavelengths such as deep ultraviolet radiation, vacuum ultraviolet radiation, electron beam (EB), X-ray and others as well as excimer laser radiation such as KrF laser radiation of the wavelength of 248 nm and ArF laser radiation of the wavelength of 193 nm. Note that the term "radiation" used herein means all of the above-mentioned radiations.

In the formation of submicron-ordered resist patterns using as patterning radiation in the far ultraviolet or vacuum ultraviolet regions, it is necessary to use specific resist materials having an excellent transparency to the patterning radiation and also a high resistance to dry etching. The inventors of this application have studied this and found that said need is satisfied by a radiation-sensitive material comprising a polymer or copolymer of acrylic acid ester or a-substituted acrylic acid ester in which the ester portion contains an adamantyl skeleton (see, Japanese Unexamined Patent Publication (Kokai) No. 4-39665).

Further, in Japanese Unexamined Patent Publication (Kokai) No. 9-73173, the inventors of this application have suggested a chemically amplified resist material which comprises an acid-sensitive, alkali-insoluble compound and a photoacid generator capable of producing an acid upon exposure of the resist material to a patterning radiation. The acid-sensitive, alkali-insoluble compound is characterized by containing a protected alkali-soluble group in which an alicyclic hydrocarbon group having, bonded to a carbon atom thereof, a lower alkyl group is contained as a protective group, and it is cleaved from the alkali-soluble group upon action of an acid so that the compound becomes alkali-soluble. Using this resist material in the formation of fine resist patterns, since the alicyclic hydrocarbon group can be cleaved and thus removed from the resist material, it becomes possible to inhibit peeling off of the resist patterns from the substrate during the development process.

In addition, in Japanese Unexamined Patent Publication (Kokai) No. 9-90637, the inventors of this application have suggested another chemically amplified resist material which is characterized by using, in combination, an acid-sensitive polymer with the monomeric unit having in a side chain thereof a protective group-containing carboxyl group, the protective group being a specific lactone structure, and a photoacid generator. Using this resist material, it becomes possible to form fine resist patterns having a practically usable sensitivity and an excellent adhesion to the substrate, because of presence of the specific lactone structure.

As is described in detail in each of the above-referred patent publications, the chemically amplified resist materials invented by the inventors of this application can provide many attractive effects. In particular, the resist materials having both of a cleavable cyclic hydrocarbon structure and a lactone structure can exhibit highly improved performances. These resist materials, however, suffer from a high production cost. This is because, in the production of the resist materials, particularly in the production of a monomer with the lactone structure used as a starting material, various steps of the production are required, and a purification of the monomer must be carried out using a purification column, because the conventional distillation process cannot be used. Further, the lactone structure, since it contains oxygen atoms in a high content, can deteriorate a resistance to dry etching.

SUMMARY OF THE INVENTION

Accordingly, one object of the present invention is to provide a novel chemically amplified resist material containing both of a cleavable cyclic hydrocarbon group and a lactone structure in an acid-sensitive polymer as the basic resin, in which material the content of the lactone structure in the polymer can be reduced without adversely affecting the various characteristics derived from the cyclic hydrocarbon group and the lactone structure, and can simultaneously satisfy the requirements for a high resolution, high sensitivity and excellent resistance to dry etching.

Another object of the present invention is to provide an improved process for the formation of the resist patterns using the novel resist material of the present invention.

The above objects and other objects of the present invention will be appreciated from the descriptions as set forth below with regard to the preferred embodiments thereof.

According to one aspect thereof, the present invention provides a chemically amplified resist material which comprises:

I. an acid-sensitive terpolymer produced upon copolymerization of
   (i) a first monomer unit having a structure which contains an alkali-soluble group protected with an alicyclic hydrocarbon-containing protective group and in which structure said alkali-soluble group is cleaved with an acid to thereby permit said terpolymer to exhibit a solubility in an alkaline solution,
   (ii) a second monomer unit having a lactone structure, and (iii) a third monomer unit having a structure which contains an alkali-soluble group protected with a protective group different from that of said first monomer unit and in which structure said alkali-soluble group is cleaved with an acid to thereby permit that said terpolymer exhibits a solubility in an alkaline solution, said second monomer unit being contained
in an amount of 10 to 35% by mole based on a total amount of said terpolymer; and II. a photoacid generator capable of producing an acid upon exposure to a patterning radiation.

Further, the present invention, according to another aspect thereof, provides a process for the formation of resist patterns which comprises the steps of:

coating the chemically amplified resist material of the present invention on a substrate to be fabricated in order to form a resist film thereon;

selectively exposing said resist film to a patterning radiation capable of causing generation of an acid by said photoacid generator; and developing a latent image formed in said resist film during said exposure step.

The chemically amplified resist material according to the present invention, as described above, is characterized by containing, as a basic resin, an acid-sensitive terpolymer, i.e., a three component copolymer, formed upon copolymerization of three specific monomer units, and at the same time, containing a second monomer unit with the lactone structure in an amount of 10 to 35% by mole based on a total amount of the terpolymer, and these characteristic features were found by the inventors of this application as a result of the following study and research.

To solve the problems concerning increase of costs and reduction of a dry etching resistance, the inventors have tried to reduce an amount of the lactone structure to be introduced into the acid-sensitive copolymer. That is, based on the recognition that in the resist material comprising a copolymer consisting of an alicyclic hydrocarbon structure and a lactone structure, the lactone structure can particularly play a role in increasing an adhesion of the resist material to the substrate, but can reduce a dry etching resistance, they have tried to ascertain a level or range of the lactone structure to be induced sufficient to obtain a satisfactory adhesion and dry etching resistance at the same time.

First, in the copolymer consisting of the alicyclic hydrocarbon structure and the lactone structure, the content of the lactone structure was tried to be gradually reduced, that is, the content of the alicyclic structure was gradually increased. When the content of the alicyclic structure becomes above 50% by mole, it was observed that the resist performance is suddenly lowered due to distortion, falling down and other defects of the resist patterns. Then, to avoid this problem, a three component copolymer (terpolymer) containing a third monomeric component in addition to about 50% by mole of the alicyclic structure and the lactone structure was prepared and used as the resist material, in place of the above-described copolymer. The third monomeric component used here was t-butyl methacrylate which has a cleavage capability and is expected to show a better dry etching resistance than the lactone structure, because it does not contain an oxygen atom in a moiety of the protective group. Generally, t-butyl methacrylate is known to show only an insufficient level of the adhesion, whereas it has a merit in availability at a very low cost, in addition to the expected increase of the dry etching resistance because of the above reason.

Based on the above findings, the formation of resist patterns was repeated using different terpolymers consisting of the alicyclic structure, the lactone structure and t-butyl methacrylate, and a relationship between the amount of the introduced t-butyl methacrylate and the resulting adhesion was evaluated in the obtained resist patterns. As a result, it was found that a satisfactory adhesion, sufficient for practical use in the resist material, could be obtained if an amount of the lactone structure introduced into the terpolymer is at least 10% by mole, and a dry etching resistance would be deteriorated at the lactone amount above 35% by mole. In conclusion, the inventors have found that to solve the above-described problems, it is effective to reduce an amount of the lactone structure to be introduced into the terpolymer to an acceptable and lowest level, and at the same time, to add a third structure, which should be available at a low cost, to compensate for the demerits which will be caused upon reduction of the lactone structure, and have thus completed the present invention.

DESCRIPTION OF PREFERRED EMBODIMENTS

In the practice of the present invention, the acid-sensitive terpolymer used as a basic resin in the chemically amplified resist material is that produced upon copolymerization of the following monomer units:

first monomer unit containing an alkali-soluble group protected with a protective group containing an alicyclic hydrocarbon group;

second monomer unit having a lactone structure; and third monomer unit containing an alkali-soluble group protected with a protective group which is different from that for the alkali-soluble group of the first monomer unit. In such an acid-sensitive terpolymer, when an acid is generated from a photoacid generator (PAG), used in combination with the terpolymer, as a function of patterning exposure, the alkali-soluble group of each of the first and third monomer units which has been protected with the protective group is cleaved with the acid, and therefore the terpolymer now can exhibit a solubility in alkali. Since the terpolymer in an exposed area of the resist material is soluble in an alkaline solution, the exposed area of the resist material is dissolved and removed from the substrate, thereby providing the desired resist patterns.

More particularly, the acid-sensitive terpolymer advantageously used in the practice of the present invention, as described hereinabove, contains one or more alkali-soluble groups in at least the first and second monomer units of the terpolymer. Examples of suitable alkali-soluble groups, although they are not restricted to those below-mentioned, include a carboxylic acid group, sulfonic acid group, amide group, imide group and phenol group. In particular, a carboxylic acid group can be preferably used as the alkali-soluble group.

In the first monomer unit of the acid-sensitive terpolymer of the present invention, the above-described alkali-soluble carboxylic acid group or others have to be initially protected with a certain alicyclic hydrocarbon-containing protective group for the purpose of inhibiting dissolution of the terpolymer in an alkaline developer. The alicyclic hydrocarbon to be contained in the protective group includes a variety of alicyclic hydrocarbon groups which are well-known in the field of chemically amplified resists. Suitable alicyclic hydrocarbon groups include, although they are not restricted to, those containing the following compounds as the skeleton:

(1) adamantane and derivatives thereof;
(2) norbornane and derivatives thereof;
(3) perhydroanthracene and derivatives thereof;
(4) perhydronaphthalene and derivatives thereof;
(5) tricyclo[5. 2. 1. 0$^{2.6}$]decane and derivatives thereof;
(6) cyclohexane, methylcyclohexane, dimethylcyclohexane, bicyclohexane and derivatives thereof;
(7) spiro[4, 4]nonane and derivatives thereof; and
(8) spiro[4, 5]decane and derivatives thereof.

These compounds have the following structures:

(1)

(2)

(3)
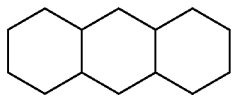

(4)
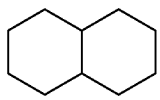

(5)
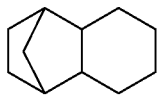

(6)
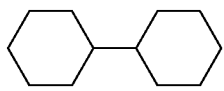

(7)
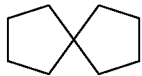

(8)
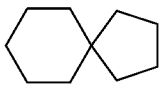

Note, in the above formulae, the formula (6) is a formula of bicyclohexane.

Further, in this first monomer unit, the monomer unit itself may have any different structures which are generally known and adopted as a backbone structure of the resist polymers in the field of resist chemistry, and typical examples thereof include (meth)acrylate monomer units, i.e., acrylate and methacrylate monomer units, vinyl phenol monomer units, vinyl benzoate monomer units, N-substituted maleimide monomer units, styrene monomer units and the like. Particularly, the (meth)acrylate monomer units can be preferably used as the backbone structure of the first monomer unit.

In the acid-sensitive terpolymer of the present invention, the second monomer unit essentially contains a lactone structure. The lactone structure suitable in the practice of the present invention is represented by the following formula (I) or (II):

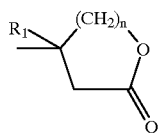 (I)

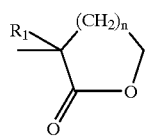 (II)

in which $R_1$ represents a hydrogen atom or a substituted or unsubstituted, direct chain or branched chain hydrocarbon group of 1 to 4 carbon atoms, preferably a lower alkyl group such as methyl, ethyl or butyl, and n is an integer of 1 to 4.

Further, in this second monomer unit containing the lactone structure, the monomer unit itself may have any structure which is generally known and adopted as a backbone structure of the resist polymers in the field of resist chemistry, and typical examples thereof include (meth) acrylate monomer units, i.e., acrylate and methacrylate monomer units, vinyl phenol monomer units, vinyl benzoate monomer units, N-substituted maleimide monomer units, styrene monomer units and the like. Particularly, the (meth) acrylate monomer units can be preferably used as the backbone structure of the second monomer unit.

Furthermore, typical examples of the second monomer unit containing the lactone structure, although they are not restricted to the below-mentioned, include the structure units represented by the following formulae. Note, in the formulae, that LAC represents a lactone structure, typical examples of which include those of the above-described formulae (I) and (II), R represents an optional substituent and preferably it may be the same or different and each represents a hydrogen atom, a halogen atom such as chlorine or bromine, a substituted or unsubstituted, direct chain or branched chain hydrocarbon group such as an alkyl group, for example, methyl, ethyl, n-propyl, i-propyl, n-butyl, i-butyl, t-butyl and the like, a cyano group and the like, and m represents a content (mole number) of the second monomer unit in the terpolymer of the present invention.

(meth)acrylate:

(vinyl)phenol:

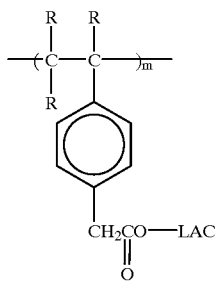

vinyl benzoate:

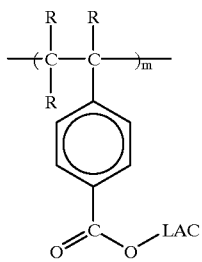

norbornene carboxylic acid:

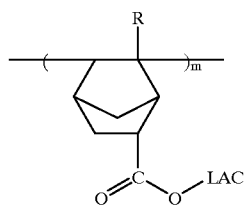

As described hereinabove, the second monomer unit may ensure its desired function and effects, if it is contained in an amount of at least 10% by mole in the acid-sensitive terpolymer. An upper limit of the content of the second monomer unit is preferably 35% by mole or less in view of resistance to dry etching.

In the acid-sensitive terpolymer of the present invention, the third monomer unit essentially contains an alkali-soluble group and the alkali-soluble group is protected with a protective group which is different from that of the first monomer unit. The third monomer unit, as described above, is included in the acid-sensitive terpolymer to attain both of a reduction in the production cost and an improvement of the dry etching resistance, without relying upon the lactone structure as in the conventional chemically amplified resist materials, and thus it has to have the structure, function and the like enabling such improvement. The third monomer unit is not restricted to the specific one, as long as it contains a protective group capable of being cleaved upon the action of an acid, is available at a lower cost, and does not adversely affect the desired performances of the resist, however, in view of a good resistance to dry etching, it is preferred to use the third monomer unit in which the protective group contains no or few oxygen atoms. Accordingly, typical examples of the protective group to be contained in the third monomer unit include t-butyl group, t-amyl group and similar groups, and particularly t-butyl group can be advantageously used as the protective group. As the result of introduction of such third monomer unit in the acid-sensitive terpolymer, it becomes possible to improve the dry etching resistance, along with a reduction in the production cost.

The alkali-soluble group to be contained in the third monomer unit is not restricted to the specific one, however, as in the first monomer unit described above, a carboxylic acid group, sulfonic acid group, amide group, imide group, phenol group and the like may be preferably used, more preferably, a carboxylic acid group.

Further, in this third monomer unit, the monomer unit itself may have any different structures which are generally known and adopted as a backbone structure of the resist polymers in the field of resist chemistry, and typical examples thereof include (meth)acrylate monomer units, i.e., acrylate and methacrylate monomer units, vinyl phenol monomer units, vinyl benzoate monomer units, N-substituted maleimide monomer units, styrene monomer units and the like, as in other monomer units. Particularly, the (meth)acrylate monomer units can be preferably used as the backbone structure of the third monomer unit.

Preferably, the acid-sensitive terpolymer used as the basic resin in the chemically amplified resist materials of the present invention is represented by the following formula (III):

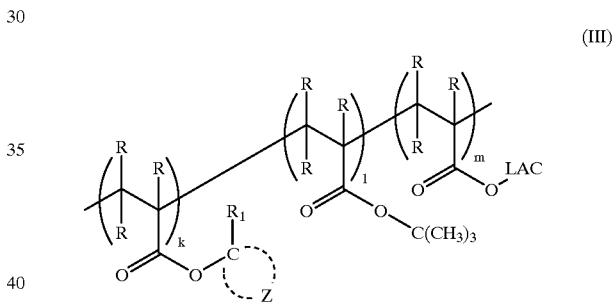

in which
R and LAC each is as defined above,
$R_I$ represents a substituted or unsubstituted, direct chain or branched chain hydrocarbon group of 1 to 4 carbon atoms, preferably a lower alkyl group,
Z represents atoms necessary to complete an alicyclic hydrocarbon group, described above, along with a carbon atom to which the —$R_I$ group is bonded, and
k, l and m each is a number of the monomer unit constituting the acid-sensitive terpolymer, and a molar ratio of k:l:m is in the range of 45 to 75:15 to 40:10 to 35.

A molecular weight (weight average molecular weight, Mw) of the acid-sensitive terpolymer having the above-described structure is not specifically restricted, and thus can be widely varied. Generally, the molecular weight is preferred to be in the range of about 1,000 to 30,000.

More particularly, the acid-sensitive terpolymer which can be advantageously used in the practice of the present invention, although it is not restricted, includes the following terpolymers. Note, in the below-mentioned formulae, that t-Bu is an abbreviation of t-butyl group, and k, l and m each is as defined above.

Copolymer of 2-methyl-2-adamantyl methacrylate, t-butyl methacrylate and mevalonic lactone methacrylate:

(IV)

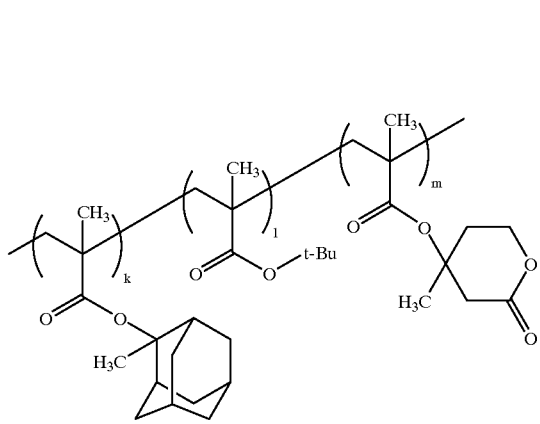

Copolymer of isobornyl methacrylate, t-butyl methacrylate and mevalonic lactone methacrylate:

(V)

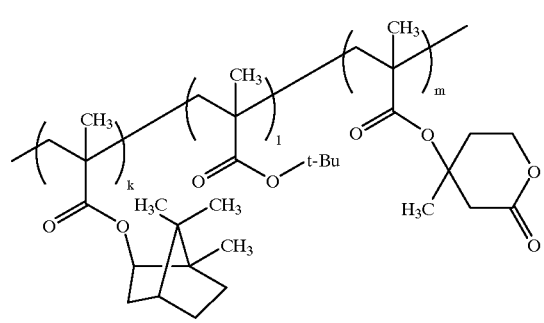

Copolymer of 2-methyl-2-adamantyl methacrylate, t-butyl methacrylate and γ-butylolactone-3-yl methacrylate:

(VI)

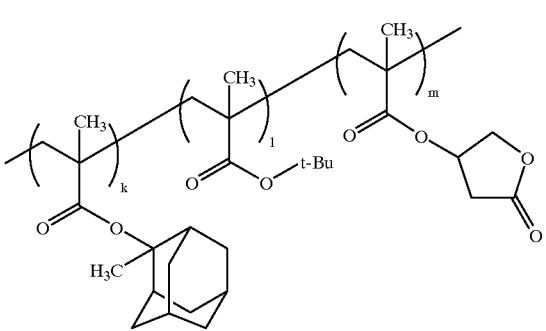

Copolymer of 2-inethyl-2-adainantyl methacrylate, t-butylmethacrylate and 3-inethyl-γ-butylolactone-3-yl methacrylate:

(VII)

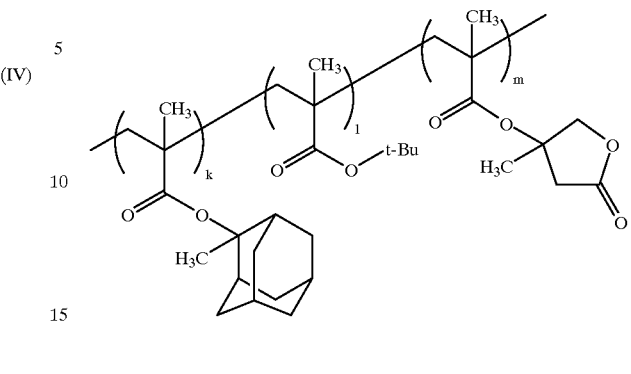

Copolymer of 2-methyl-2-adamantyl methacrylate, t-butylmethacrylate and γ-butylolactone-2-yl methacrylate:

(VIII)

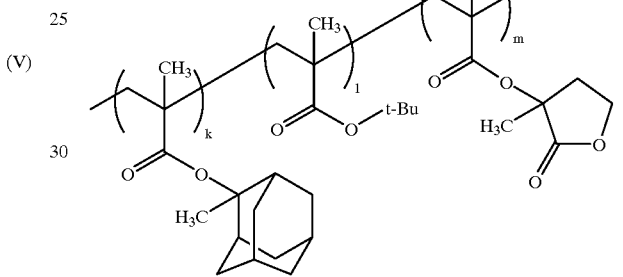

If necessary, the above-described acid-sensitive terpolymer may additionally contain an alkali-soluble polymer or copolymer such as a novolak resin, a phenol resin, an imide resin, a carboxylic acid-containing resin, and other resins.

In the chemically amplified resist material according to the present invention, a photoacid generator (PAG) capable of being decomposed upon exposure to a patterning radiation to thereby produce an acid capable of causing cleavage of a protective group of the protected alkali-soluble group is used in association with the above-described acid-sensitive terpolymer. The photoacid generator used herein may be any conventional agent which is well-known as a photoacid generator (PAG) in resist chemistry, namely, compounds capable of generating a protonic acid upon exposure of the resist film to a patterning radiation such as ultraviolet radiation, far ultraviolet radiation, vacuum ultraviolet radiation, electron beam, X-ray and laser light. Typical examples of the photoacid generator suitably used in the practice of the present invention include various compounds described hereinafter, although the present invention should not be restricted to these compounds.

(1) diazonium salts represented by the following formula:

$$Ar-N_2^+X^-$$

in which

Ar represents a substituted or unsubstituted aromatic group, for example, phenyl group or phenyl group substituted with halogen such as chlorine, bromine, iodine or fluorine, alkyl such as methyl or t-butyl, aryl or other substituent groups, or a substituted or unsubstituted alicyclic hydrocarbon group, and X represents halogen, $BF_4$, $BF_6$, $PF_6$, $AsF_6$, $SbF_6$, $CF_3SO_3$, $ClO_4$ or anion of organic sulfonic acids.

(2) iodonium salts represented by the following formula:

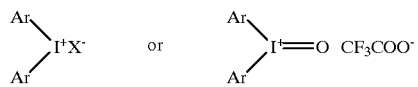

in which Ar and X are as defined above.

(3) sulfonium salts represented by the following formulae:

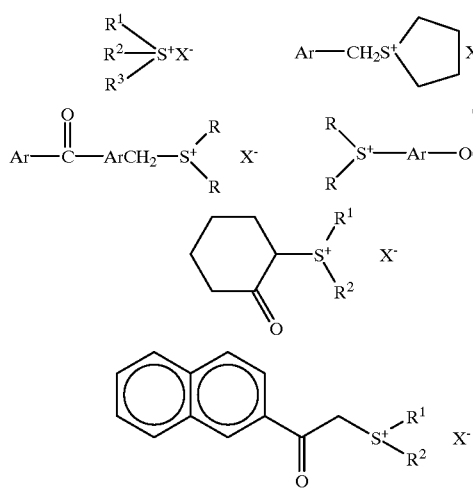

in which R, Ar and X each is as defined above, and $R^1$, $R^2$ and $R^3$ may be the same or different and each represents a hydrogen atom or any substituent group, for example, a halogen atom, an alkyl group, an aryl group and the like, and, for example, R is methyl and the like and $R^1$, $R^2$ and $R^3$ each is phenyl and the like.

(4) sulfonic esters represented by the following formula:

or

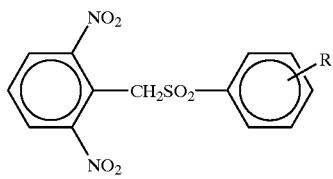

in which Ar and R are as defined above.

(5) oxazole derivatives represented by the following formula:

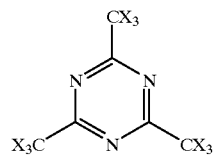

in which X is as defined above with the proviso that at least one of the substituents —$CX_3$ is a substituted or unsubstituted aryl or alkenyl.

(6) s-triazine derivatives represented by the following formula:

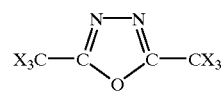

in which X is as defined above with the proviso that at least one of the substituents —$CX_3$ is a substituted or unsubstituted aryl or alkenyl.

(7) disulfone derivatives represented by the following formula:

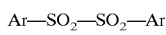

in which

Ar is as defined above.

(8) imide compounds represented by the following formula:

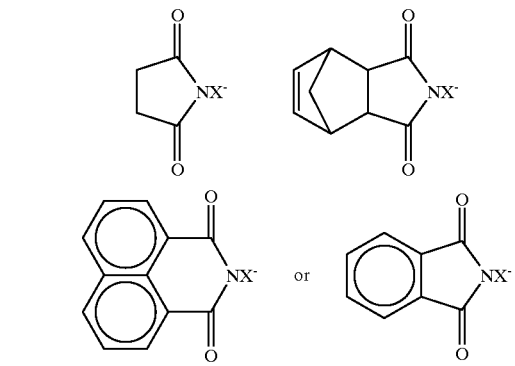

in which X is as defined above.

(9) others such as oxime sulfonate, diazonaphtoquinone, benzoine tosylate and the like.

More particularly, some of the above-described compounds can be represented by the following formulae:

triphenylsulfonium triflate:

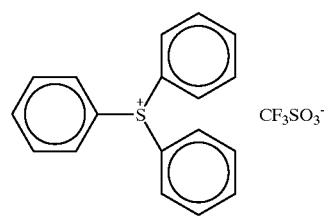

triphenylsulfonium hexafluoroantimonate:

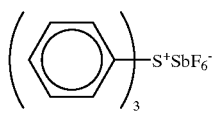

triphenylsulfonium hexafluorophosphate:

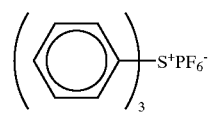

diphenyliodo hexafluorophosphate:

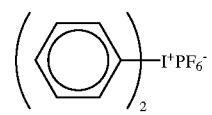

benzoine tosylate:

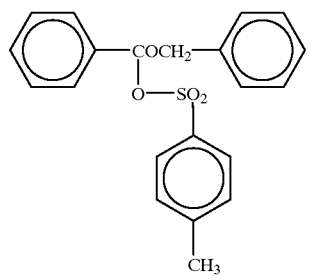

naphthylimidyl triflate:

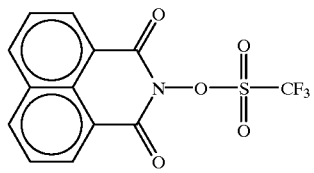

cyclohexylmethyl(2-oxocyclohexyl)-sulfonium trifluoromethane sulfonate:

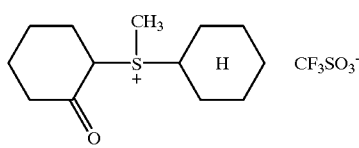

In the practice of the present invention, the chemically amplified resist material is prepared by using as the starting materials the above-described acid-sensitive terpolymer and photoacid generator (PAG). The preparation of such resist material can be prepared by using the terpolymer obtained in accordance with the conventional polymerization methods. For example, the selected monomers which are necessary to constitute the repeating units of the target terpolymer are polymerized in the presence of a suitable polymerization initiator, and then the obtained terpolymer is added with a photoacid generator, followed by dissolving the mixture in an organic solvent such as ethyl lactate and the like as a dispersant to form a resist solution.

The polymerization conditions and polymerization initiators used herein can be freely selected from a wide variety of conditions and initiators which are conventional in polymer chemistry. For example, if the terpolymer should be prepared in accordance with a radical polymerization process, it is preferred to use as the polymerization initiator the following compounds.

AIBN (N,N'-azoisobutylonitrile):

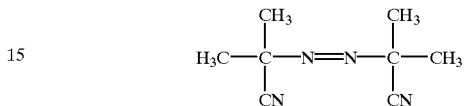

MAIB (dimethyl-2,2-azoisobutylate):

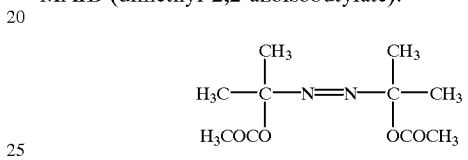

In the preparation of the chemically amplified resist material, an amount of the photoacid generator added to the acid-sensitive terpolymer may be widely varied depending upon its acid releasing capability, the desired properties of the resist material and other factors, however, it is generally preferred that the photoacid generator is added in an amount of about 1 to 30% by weight, more preferably in the range of about 1 to 15% by weight, based on the total weight of the acid-sensitive terpolymer.

Further, the organic solvents used in the preparation of the resist solution may be widely varied depending on various factors such as the resist material used, coating conditions and the like, and typical examples of suitable organic solvents, although they are not restricted to the below-mentioned, include ethyl lactate, propyleneglycol methyl-etheracetate (PGMEA), ethyl pyruvate, cyclohexanone, methyl amyl ketone, methyl-3-methoxypropionate, ethyl-3-ethoxypropionate, diacetoalcohol and similar organic solvents. These organic solvents may be used alone or, if desired, may be used as a mixture of two or more solvents. Particularly, it has observed that ethyl lactate, PGMEA and ethyl pyruvate are effective in the production of resist patterns having a high contrast.

In the preparation of the resist solution, if desired, an auxiliary solvent may be used in addition to the above-described organic solvent (hereinafter referred to as "main solvent"). The auxiliary solvent is not required if the resist components can be easily dissolved in the main solvent, however, if the resist components can hardly be dissolved in the main solvent with difficulty, the auxiliary solvent will assist in dissolving the resist components in the main solvent. Useful auxiliary solvents, although they are not restricted to those below-mentioned, include butyl acetate, γ-butylolactone, propyleneglycol methylether and similar solvents.

Furthermore, in order to prevent a striation of the resist solution after coating thereof, it is effective to add a surface active agent to the resist solution. Suitable surface active agents include, for example, "KR-341" (trade name), commercially available from Shin-etsu Kagaku Kogyo Co., and the like. In addition, if desired, a quenching compound for acids, i.e., weak basic compounds such as a substituted amine compound, a nitrile compound, a N-methyl pyrrolidone compound and the like may be added to the resist.

In another aspect thereof, the present invention resides in an improved process for forming resist patterns, particularly positive-working resist patterns, on a substrate to be fabricated, the process comprising the steps of:

coating the above-described chemically amplified resist material according to the present invention on the substrate to form a resist film;

selectively exposing the resist film to a patterning radiation capable of causing generation of an acid from the photoacid generator in the resist film; and developing a latent image formed in the resist film upon the selective exposure in the above step.

In the process for the formation of the resist patterns according to the present invention, it is essential to include a step of heating the exposed resist film at an elevated temperature between the exposure step and the development step. The heating step is generally referred in the field of the resist chemistry to as "Post Exposure Baking" or briefly "PEB".

The formation of the resist patterns according to the present invention can be carried out in a manner considered conventional in the field of the chemically amplified resist materials, and preferably it can be carried out as follows.

First, a solution of the resist material, prepared as described above, is coated on a substrate to be fabricated, to thereby form a resist film having a predetermined thickness. The substrate used herein may be any conventional substrate used in the field of the production of semiconductor devices and other devices, and typical examples of suitable substrates include semiconductor substrates such as a silicon substrate, a glass substrate, a SOS substrate, a non-magnetic substrate such as ceramic substrate and the like. If desired, the substrate may additionally contain one or more overlaying layers such as a polysilicon layer, an oxide layer, for example, a silicon oxide layer, a nitride layer, for example, a silicon nitride layer, a metallic layer, for example, an aluminum layer, an insulating interlayer, a magnetic layer and the like. Further, the substrate and/or the overlaying layer(s) may contain any elements such as wiring or circuits fabricated therein. Furthermore, in order to increase the adhesion strength of the resist film to the substrate, a surface of the substrate may be subjected to a conventional hydrophobic treatment. Typical examples of the chemicals advantageously used in this treatment are 1,1,1,3,3,3-hexamethyldisilazane (HMDS) and the like.

Coating of the resist solution may be preferably made by using any conventional coating devices such as a spin coater, a dip coater, a roller coater and the like. Preferably, the spin coater can be used to dropwise add the resist solution on a surface of the substrate, thereby forming a thin film of the resist solution. A thickness of the resist film may be widely varied depending on the field of use of the resist patterns and other factors, and generally it is preferred that the layer thickness is in the range of about 0.3 to 2.0 μm.

Next, prior to selective exposure of the resist film to a patterning exposure, it is preferred that the resist film is prebaked at a temperature of about 40 to 170° C., more preferably about 60 to 120° C., for about 60 to 180 seconds. Prebaking may be carried out by using any heating means conventionally used in the resist process. Suitable heating means include, for example, a hot plate, infrared (IR) heating oven, microwave heating oven and the like.

In addition, if a topcoat layer or protective layer is to be applied over the resist film, it is contemplated to spin-coat a solution of an olefinic resin over the resist film, followed by baking the olefinic coating at a predetermined temperature such as about 100° C.

After the formation of the resist film and prebaking, the prebaked resist film is selectively exposed to a patterning radiation in a conventional exposure device or aligner. Suitable exposure devices include commercially available devices such as ultraviolet (far UV, deep UV or vacuum UV) exposure devices, X-ray exposure devices, electron beam exposure systems and excimer steppers, for example. The conditions of exposure can be varied to select the optimum condition in each process, after taking various factors into consideration. As a result of the selective exposure, the photoacid generator (PAG) in the exposed areas of the resist film is decomposed, and thus the exposed resist film is now ready for dissolving off from the substrate in the subsequent development step. Thus, a circuit pattern of the reticle used in the exposure step is transferred to and recorded in the resist film.

Immediately after completion of the exposure, the resist film is heated on a heating means such as a hot plate. As mentioned above, the heating is called Post-Exposure Baking (PEB), and PEB is preferably carried out at a temperature sufficient to cause cleavage of the protective group from the protected alkali-soluble group in the acid-sensitive terpolymer in the resist film in the presence of a catalytic acid produced from the photoacid generator. PEB may be carried out in a manner similar to that of the above-described prebaking, and generally it can be carried out at a temperature of from about 60 to the temperature at which the basic resin of the resist can decompose, preferably about 90 to 150° C., for about 30 to 240 seconds. Further, when the resist film is used in combination with the topcoat layer, it is necessary to separate and remove the topcoat layer in any suitable manner such as use of a remover, for example, an organic solvent, after PEB and before the development.

As a final step of the present process, the heated resist film is developed with a liquid developer in accordance with any conventional method. Suitable apparatuses for use in this development step include the well-known developers such as a spin developer, dip developer and spray developer.

Typical examples of the suitable liquid developer include an aqueous or alcoholic solution of hydroxides of metals belonging to the groups I and II of the periodic table such as potassium hydroxide or an aqueous or alcoholic solution of organic bases free from metal ions such as tetraalkylammonium hydroxide, typical examples of which will be described hereinafter with reference to the chemical formulas thereof. Further, if desired, the alkaline solution used as the developer may additionally contain any additives such as a surface active agent in order to improve the resulting development effect.

More preferably, the liquid developers used in the practice of the present invention are those described in Japanese Unexamined Patent Publication (Kokai) No. 7-23053, that is, an aqueous or alcoholic solution containing as the developer an ammonium compound represented by the following formula:

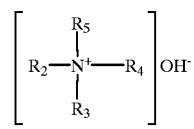

in which $R_2$, $R_3$, $R_4$ and $R_5$ may be the same or different, and each represents a substituted or unsubstituted alkyl group of 1 to 6 carbon atoms, a morpholine compound represented by the following formula:

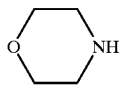

or a mixture thereof. The ammonium compound useful as the developer, although it is not restricted to the below-mentioned, includes:

tetramethylammonium hydroxide (TMAH),
tetraethylammonium hydroxide (TEAH),
tetrapropylammonium hydroxide (TPAH),
tetrabutylammonium hydroxide (TBAH), and the like.

The developer is dissolved in water or an alcohol such as methanol, ethanol, isopropyl alcohol and the like to obtain a developing solution. The concentration of the developer in the developing solution may be widely varied, however, it is generally in the range of about 0.1 to 15% by weight, preferably in the range of about 0.1 to 10% by weight. Generally, an aqueous solution of 2.38% by weight of tetramethylammonium hydroxide (TMAH) is advantageously used as the developing solution. The developing time may also be widely varied, however, it is generally in the range of about 10 seconds to about 20 minutes, preferably in the range of about 30 seconds to about 5 minutes. As a result of development, the exposed areas of the resist film are dissolved and removed from a surface of the substrate, thereby forming the desired positive resist patterns corresponding to the exposure pattern. Finally, the resulting resist patterns are rinsed with deionized water, and dried in accordance with the conventional manner.

As can be understood from the above-mentioned descriptions and the appended working examples, according to the present invention, since the chemically amplified resist material contains the specific acid-sensitive terpolymer constituted from three specific repeating units in the described ratio, it becomes possible to further increase a dry etching resistance and, at the same time, reduce a production cost, in addition to the advantages inherent in the chemically amplified resist materials, that is, high resolution, high sensitivity and excellent resistance to dry etching.

EXAMPLES

The present invention will be further described with reference to the appended working examples. Note, however, that the examples are included herein for only explanation purpose and they do not restrict the present invention.

Example 1

Preparation of Terpolymers of 2-methyl-2-adamantyl methacrylate, t-butylmethacrylate and mevalonic lactone methacrylate (2MAdMA-tBuMA-MLMA) with Different Composition Ratios First, the 2MAdMA-tBuMA-MLMA terpolymer (terpolymer 3) included in the scope of the present invention was prepared in accordance with the following procedure.

2-methyl-2-adamantyl methacrylate (2MAdMA), t-butylmethacrylate (tBuMA) and mevalonic lactone methacrylate (MLMA) in a molar ratio of 50:30:20 were charged in an eggplant type flask as a reaction container to make a 1,4-dioxane solution containing 3 moles/L of the monomers. To the resulting 1,4-dioxane solution, a polymerization initiator, AIBN (N,N'-azoisobutylonitrile), in an amount of 15% by mole based on the total amount of the monomers, was added. The reaction container was dipped in an oil bath at a controlled temperature of 80° C., and the reaction was continued for about 8 hours. After completion of the reaction, the temperature of the reaction system was reduced to room temperature, and then the reaction product was poured into a large amount of methanol to precipitate a polymerization product. After the precipitate was dried, the resulting polymerization product was dissolved in tetrahydrofuran (THF), and the solution was again poured into a large amount of methanol. The thus produced precipitate was filtered and dried, and the above procedure was repeated twice to obtain a resinous product at a yield of 60%. The 1H-NMR analysis of the resinous product indicated that the product is a terpolymer of 2-methyl-2-adamantyl methacrylate, t-butyl methacrylate and mevalonic lactone methacrylate (composition ratio of 54:28:18) (terpolymer 3). Further, the GPC analysis of the resulting terpolymer indicated that the terpolymer has a weight average molecular weight (Mw) of 9,000 and a degree of polydispersion (Mw/Mn) of 1.82.

Further, the above procedure was repeated to prepare three different terpolymers of 2MAdMA-tBuMA-MLMA (terpolymers 2, 4 and 5) within the scope of the present invention with the proviso that the three monomers were charged with different rates as is described in the following Table 1. The properties of the terpolymers 2, 4 and 6 are also described in the Table 1.

Furthermore, for comparison purposes, the above procedure was repeated to prepare the terpolymer of 2-MAdMA-tBuMA-MLMA (terpolymer 1, not included in the scope of the present invention) and the copolymer of 2-MAdMA-MLMA (for convenience, referred to as "terpolymer 6", not included in the scope of the present invention). The properties of the terpolymers 1 and 6 are described in Table 1.

TABLE 1

| terpolymer number | charging ratio 2MAdMA/ tBuMA/MLMA | composition ratio | weight average molecular weight Mw | degree of poly-dispersion Mw/Mn |
| --- | --- | --- | --- | --- |
| 1 (comparison) | 50:45:5 | 51:43:6 | 6800 | 1.79 |
| 2 | 50:40:10 | 54:36:10 | 7700 | 1.80 |
| 3 | 50:30:20 | 54:28:18 | 9000 | 1.82 |
| 4 | 50:20:30 | 54:19:27 | 9400 | 1.92 |
| 5 | 50:10:40 | 53:12:35 | 10200 | 1.97 |
| 6 (comparison) | 50:0:50 | 49:0:51 | 14700 | 2.03 |

Note in the above table that there are small differences between the charging ratio of 2MAdMA, tBuMA and MLMA as the monomers and a composition ratio of the same monomers in the resulting terpolymer, however, such differences are negligible, because they were considered to be minor errors caused during the measurement.

Example 2

Formation and Evaluation of the Resist Patterns

Each of the terpolymers 2 to 5 prepared in Example 1 was dissolved in polyethyleneglycol methyletheracetate (PGMEA) to make a solution containing the terpolymer at a concentration of 14% by weight, and the resultant solution was added with triphenylsulfonium triflate (TPSSO$_3$CF$_3$) as a photoacid generator in an amount of 2% by weight based on the weight of the terpolymer, and then the mixture was dissolved in ethyl lactate to make a resist solution containing the resinous components in an amount of 14% by weight. The resist solution was spin-coated on a silicon substrate which has been treated with HMDS, and prebaked at 120° C. for 60 seconds on a hot plate to form a 0.4-μm thick resist film.

After prebaking, a polyolefinic resin was coated over the resist film on the substrate to form a protective coating. Then, the resist film was selectively exposed to a pattern of laser light having a wavelength of 193 nm through a reticle pattern of an IC circuit on a ArF excimer laser exposure system (Nikon, NA=0.55). Immediately after the exposure, the resist film was subjected to the post-exposure baking (PEB) on a hot plate at 120° C. for 60 seconds. After removal of the protective coating the postbaked resist film was developed with an aqueous solution of 2.38% by weight (0.27N) tetramethylammonium hydroxide (TMAH), NMD-3 (trade name) commercially available from Tokyo Ohka Co., for 60 seconds, and rinsed for 30 seconds in a purified water.

For each resist film, the positive resist patterns which correspond to the pattern of the laser light as an exposure source were thus obtained. In this example, a threshold energy Eth of the exposure dose was 5 to 50 mJ/cm$^2$, and the resolution of the patterns was 0.18 μm L/S (line & space).

Evaluation of Dry Etching Resistance

The dry etching resistance of the resist patterns was evaluated from an amount of the thickness of the resist film reduced upon dry etching by producing a resist film having a thickness of 1.0 μm in accordance with the above-described procedure. The substrate with the resist film was set in a parallel plate reactive ion etching system, and the resist film was etched under the dry etching conditions: $CF_4$ as an etching gas, gas flow rate of 100 sccm, electric power of 200w and pressure of 0.02 Torr, for 5 minutes. For each resist film, an amount of the variation (reduction) of the thickness of the resist film before and after dry etching, was evaluated to be 1.1, whereas that of the resist film of the conventional novolak resist was 1.0 (control) under the same dry etching conditions. That is, this result shows that satisfactory dry etching resistance could be obtained by using the resist materials of the present invention.

Comparative Example 1

The procedure of Example 2 was repeated. However, in this example, for comparison purposes, the terpolymer 1 (composition ratio=51:43:6) prepared in Example 1 was used in place of the terpolymers 2 to 5. The formation of the resist patterns was made, however, only the minimum pattern size of 0.30 μm L/S could be obtained due to severe peeling of the resist film from the substrate.

With regard to the dry etching resistance, the reduction of the thickness resistance of the resist film was evaluated to be 1.1, i.e., same as that of Example 2, whereas that of the conventional novolak resists was 1.0 (control).

Comparative Example 2

The procedure of Example 2 was repeated. However, in this example, for comparison purposes, the terpolymer 6 (composition ratio=49:0:51) prepared in Example 1 was used in place of the terpolymers 2 to 5. The formation of the resist patterns was made with the satisfactory results, that is, good adhesion of the resist patterns to the substrate and the minimum pattern size of 0.20 μm L/S.

With regard to the dry etching resistance, the reduction of the thickness of the resist film was evaluated to be 1.2, whereas that of the conventional novolak resists was 1.0 (control). That is, this result evidences that the tested resist material shows a poor dry etching resistance compared to those of Example 2.

Example 3

The procedure of Example 2 was repeated with the proviso that the same amount of the terpolymer of isobornyl methacrylate, t-butyl methacrylate and mevalonic lactone methacrylate (IBMA-tBuMA-MLMA, composition ratio= 51:28:21, prepared in accordance with the manner similar to that of Example 1) was used as a basic resin in place of the terpolymer of 2-MAdMA-tBuMA-MLMA. The good resolution and dry etching resistance comparable to those of Example 2 could be obtained. The minimum pattern size was 0.19 μm L/S.

Example 4

The procedure of Example 2 was repeated with the proviso that the same amount of the terpolymer of 2-methyl-2-adamantyl methacrylate, t-butyl methacrylate and γ-butylolactone-3-yl methacrylate (2MAdMA-tBuMA-HGBMA, composition ratio=50:20:30, prepared in accordance with the manner similar to that of Example 1) was used as a basic resin in place of the terpolymer of 2-MAdMA-tBuMA-MLMA. The good resolution and dry etching resistance comparable to those of Example 2 could be obtained along with a good adhesion of the patterns to the substrate. The minimum pattern size was 0.18 μm L/S, at a PEB temperature of 120° C.

Example 5

The procedure of Example 4 was repeated with the proviso that the same amount of the terpolymer of 2-methyl-2-adamantyl methacrylate, t-butyl methacrylate and 3-methyl-γ-butylolactone-3-yl methacrylate (2MAdMA-tBuMA-MBLMA, composition ratio=50:20:30, prepared in accordance with the manner similar to that of Example 1) was used as a basic resin in place of the terpolymer of 2-MAdMA-t-BuMA-HGBMA. Satisfactory results similar to those of Example 4 could be obtained Example 6

The procedure of Example 4 was repeated with the proviso that the same amount of the terpolymer of 2-methyl-2-adamantyl methacrylate, t-butyl methacrylate and γ-butylolactone-2-yl methacrylate (2MAdMA-tBuMA-GBLMA, composition ratio=50:20:30, prepared in accordance with the manner similar to that of Example 1) was used as a basic resin in place of the terpolymer of 2-MAdMA-t-BuMA-HGBMA. The resolution and dry etching resistance similar to those of Example 4 could be obtained along with a good adhesion of the patterns to the substrate. The minimum pattern size was 0.22 μm L/S at the PEB temperature of 120° C.

What is claimed is:

1. A chemically amplified resist material which comprises:
   I. an acid-sensitive terpolymer produced upon copolymerization of
      (i) a first monomer unit having a structure which contains an alkali-soluble group protected with an alicyclic hydrocarbon-containing protective group and in which structure said alkali-soluble group is cleaved with an acid to thereby permit said terpolymer to exhibit a solubility in an alkaline solution, (ii) a second monomer unit having a lactone structure, and (iii) a third monomer unit having a structure which contains an alkali-soluble group protected with a protective group different from that of said first monomer unit and in which structure said alkali-soluble group is cleaved with an acid to thereby permit said terpolymer to exhibit a solubility in an alkaline solution, said second monomer unit being contained in an amount of 10 to 35% by mole based on a total amount of said terpolymer; and II. a photoacid generator capable of producing an acid upon exposure to a patterning radiation.

2. The chemically amplified resist material according to claim 1, in which the alicyclic hydrocarbon of said first monomer unit is originated from one member selected from the group consisting of:

(1) adamantane and derivatives thereof;
(2) norbornane and derivatives thereof;
(3) perhydroanthracene and derivatives thereof;
(4) perhydronaphthalene and derivatives thereof;
(5) tricyclo[5. 2. 1. $0^{2,6}$] decane and derivatives thereof;
(6) cyclohexane, methylcyclohexane, dimetylcyclohexane, bicyclohexane and derivatives thereof;
(7) spiro[4, 4]nonane and derivatives thereof; and
(8) spiro[4, 5]decane and derivatives thereof.

3. The chemically amplified resist material according to claim 1, in which the lactone structure contained in said second monomer unit is represented by the following formula (I) or (II):

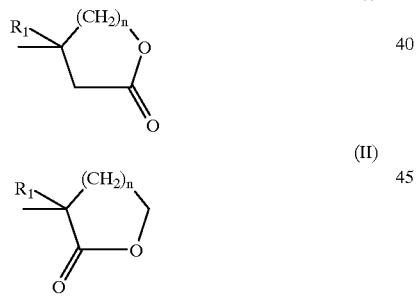

in which $R_1$ represents a hydrogen atom or a substituted or unsubstituted hydrocarbon group of 1 to 4 carbon atoms, and n is an integer of 1 to 4.

4. The chemically amplified resist material according to claim 1, in which the protective group contained in said third monomer unit is t-butyl group.

5. The chemically amplified resist material according to claim 1, in which the alkali-soluble group contained in said first and third monomer units is a carboxylic acid group, a sulfonic acid group, an amide group, an imide group or a phenol group.

6. The chemically amplified resist material according to claim 1, in which said acid-sensitive terpolymer is represented by the following formula (III):

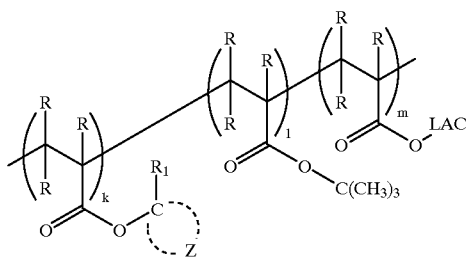

in which

R may be the same or different, and each represents a hydrogen atom, a halogen atom or a substituted or unsubstituted hydrocarbon group of 1 to 4 carbon atoms, $R_I$ represents a substituted or unsubstituted hydrocarbon group of 1 to 4 carbon atoms, Z represents atoms necessary to complete an alicyclic group along with a carbon atom to which the —$R_I$ group is bonded, LAC represents a lactone structure represented by the following formula (I) or (II):

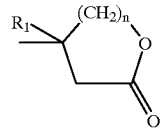

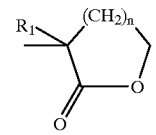

wherein $R_1$ represents a hydrogen atom or a substituted or unsubstituted hydrocarbon group of 1 to 4 carbon atoms, and n is an integer of 1 to 4, and k, l and m are each a number of the monomer unit constituting said acid-sensitive terpolymer, and a molar ratio of k:l:m is in the range of 45 to 75:15 to 40:10 to 35.

7. A process for the formation of resist patterns which comprises the steps of:

coating a chemically amplified resist material on a substrate to be fabricated in order to form a resist film thereon, said resist material comprising:

I. an acid-sensitive terpolymer produced upon copolymerization of (i) a first monomer unit having a structure which contains an alkali-soluble group protected with an alicyclic hydrocarbon-containing protective group and in which structure said alkali-soluble group is cleaved with an acid to thereby permit said terpolymer to exhibit a solubility in an alkaline solution, (ii) a second monomer unit having a lactone structure, and (iii) a third monomer unit having a structure which contains an alkali-soluble group protected with a protective group different from that of said first monomer unit and in which structure said alkali-soluble group is cleaved with an acid to thereby permit said terpolymer to exhibit a solubility in an alkaline solution, said second monomer unit being contained in an amount of 10 to 35% by mole based on a total amount of said terpolymer; and II. a photoacid generator capable of producing an acid upon exposure to a patterning radiation;

selectively exposing said resist film to a patterning radiation capable of causing generation of an acid from said photoacid generator; and developing a latent image formed in said resist film during said exposure step.

8. The process for the formation of resist patterns according to claim 7, in which said acid-sensitive terpolymer is represented by the following formula (III):

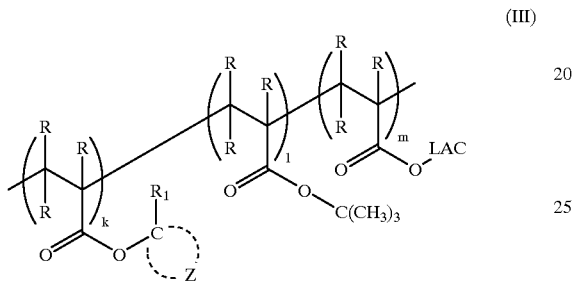

(III)

in which

R may be the same or different, and each represents a hydrogen atom, a halogen atom or a substituted or unsubstituted hydrocarbon group of 1 to 4 carbon atoms, $R_I$ represents a substituted or unsubstituted hydrocarbon group of 1 to 4 carbon atoms, Z represents atoms necessary to complete an alicyclic group along with a carbon atom to which the —$R_I$ group is bonded, LAC represents a lactone structure represented by the following formula (I) or (II):

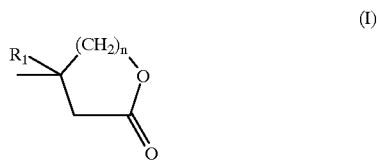

(I)

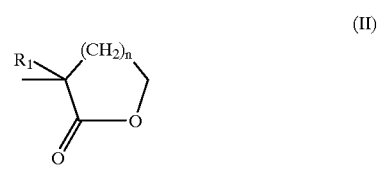

(II)

wherein $R_1$ represents a hydrogen atom or a substituted or unsubstituted hydrocarbon group of 1 to 4 carbon atoms, and n is an integer of 1 to 4, and k, l and m each is a number of the monomer unit constituting said acid-sensitive terpolymer, and a molar ratio of k:l:m is in the range of 45 to 75:15 to 40:10 to 35.

* * * * *